(12) United States Patent
Chen et al.

(10) Patent No.: US 11,635,855 B2
(45) Date of Patent: Apr. 25, 2023

(54) INFRARED TOUCH DEVICE AND PROFILE

(71) Applicants: SHENZHEN HITEVISION TECHNOLOGY CO., LTD., Shenzhen (CN); HITEVISION TECH COMPANY LIMITED, Hong Kong (CN)

(72) Inventors: Tingfeng Chen, Shenzhen (CN); Xinyi Liu, Shenzhen (CN)

(73) Assignees: SHENZHEN HITEVISION TECHNOLOGY CO., LTD., Shenzhen (CN); HITEVISION TECH COMPANY LIMITED, HongKong (CN)

(*) Notice: Subject to any disclaimer, the term of this patent is extended or adjusted under 35 U.S.C. 154(b) by 384 days.

(21) Appl. No.: 16/945,506

(22) Filed: Jul. 31, 2020

(65) Prior Publication Data

US 2021/0373701 A1 Dec. 2, 2021

(30) Foreign Application Priority Data

Jun. 2, 2020 (CN) .......................... 202010488091.3

(51) Int. Cl.
*G06F 3/042* (2006.01)
*H01L 23/04* (2006.01)
*H01L 27/144* (2006.01)

(52) U.S. Cl.
CPC ............ *G06F 3/0421* (2013.01); *H01L 23/04* (2013.01); *H01L 27/144* (2013.01)

(58) Field of Classification Search
CPC ..... G06F 3/0421; G06F 3/0428; H01L 23/04; H01L 27/144
See application file for complete search history.

(56) References Cited

U.S. PATENT DOCUMENTS

| 4,774,404 A | * | 9/1988 | Hasegawa | ................ G01V 8/20 |
| | | | | 250/221 |
| 10,241,625 B2 | * | 3/2019 | Jeong | .................... G01J 1/0414 |

(Continued)

FOREIGN PATENT DOCUMENTS

| CN | 103123556 A | * | 5/2013 | ........... G06F 3/0428 |
| CN | 103631049 A | * | 3/2014 | ........... G06F 1/1605 |

(Continued)

OTHER PUBLICATIONS

The Notice of the Grant for Chinese Application No. 202010488091. 3, dated Jan. 28, 2023, 9 pages.

*Primary Examiner* — Mark R Gaworecki
(74) *Attorney, Agent, or Firm* — East IP P.C.

(57) ABSTRACT

The present disclosure relates to an infrared touch device and a profile. The infrared touch comprises an infrared board, a light filtering portion, a panel, and an outer frame, the outer frame comprises a side frame portion, a front frame portion connected to a front end of the side frame portion, and a rear frame portion connected to a rear end of the side frame portion. The side frame portion comprises a panel accommodating groove for accommodating an edge of the panel, a rear side face of the front frame portion forms a first side wall of the panel accommodating groove, an end face of a free end of the front frame portion is defined as a first inclined surface, and an obtuse angle is formed between the first inclined surface and the first side wall.

9 Claims, 3 Drawing Sheets

(56) References Cited

U.S. PATENT DOCUMENTS

| | | | |
|---|---|---|---|
| 2011/0163998 A1 | 7/2011 | Goertz et al. | |
| 2014/0210793 A1* | 7/2014 | Eriksson | F24C 7/086 345/175 |
| 2015/0054789 A1* | 2/2015 | Chang | G06F 3/0421 345/175 |
| 2015/0055211 A1* | 2/2015 | Chang | G06F 3/04182 359/350 |
| 2015/0103272 A1* | 4/2015 | Kokusho | G02F 1/13338 349/12 |
| 2015/0131010 A1* | 5/2015 | Sugiyama | G06F 3/0428 349/12 |
| 2017/0308236 A1* | 10/2017 | Lee | G06F 3/04182 |

FOREIGN PATENT DOCUMENTS

| | | | | |
|---|---|---|---|---|
| CN | 203720810 U | | 7/2014 | |
| CN | 104391611 A | * | 3/2015 | ............ G06F 3/0421 |
| CN | 107665067 A | * | 2/2018 | |
| CN | 210120742 U | | 2/2020 | |
| CN | 210222731 U | | 3/2020 | |
| EP | 2853997 A2 | * | 4/2015 | ............ G06F 3/0421 |

* cited by examiner

INFRARED TOUCH DEVICE AND PROFILE

CROSS REFERENCE

This application claims priority to Chinese Patent Application No. 202010488091.3, filed on Jun. 2, 2020, which is hereby incorporated by reference in its entirety.

TECHNICAL FIELD

The present disclosure relates to relates to the technical filed of infrared touch technology, and particularly an infrared touch device and a profile.

BACKGROUND

An infrared touch manner is generally used in a prior touch screens, and an infrared board (for example, Printed Circuit Board Assembly, abbreviated as PCBA) in a current infrared touch solution is designed to be placed horizontally or vertically. An infrared touch circuit board assembly and a light filtering bar are fixed to a frame, and as an arrangement of the infrared touch circuit board assembly and the light filtering bar, it is bound to cause the frame to be wider and thicker. In a prior installation method, both a front side and a rear side of the light filtering bar need to be fixedly connected to the frame, which results in a distance between the light filtering bar and a display screen becoming larger and thereby a height of a touch area is basically greater than 3 mm. It means that a touch will respond when a distance between a touched object and a front side face of the display screen is 3 mm. Therefore, it is easy to cause a false touch, and touch experience feels poor. Furthermore, a presence of the infrared light filtering bar cannot be changed, so that a height of a frame profile cannot be effectively reduced, a narrow frame effect cannot be further achieved, and the effect of being close to be flat between the frame and the panel cannot be achieved. Thus an overall appearance and user experience of the infrared touch device are affected.

For example, in a traditional infrared touch device, the light filtering bar is located on a front side of the panel and is installed on the outer frame. The infrared board is located outside of the light filtering bar, so that an infrared light source on it faces the light filtering bar. Therefore, the infrared light emitted by the infrared light source can enter the light filtering bar, then exit through the light filtering bar, and enter an opposite light filtering bar along a front surface of the panel. A process of the infrared board receiving the infrared light is just the opposite. The infrared light from the opposite light filtering bar enters the light filtering bar on a receiving side, then exits through the light filtering bar and is received by the infrared board. In the infrared touch device of the above type, there is at least one dimension of a wall thickness of a profile respectively between the light filtering bar and the front surface of the frame, and between the light filtering bar and the panel, which makes a height of the front surface of the frame of the infrared touch device larger than the bigger size of the panel, and the bigger size is at least equal to the width of the light filtering bar plus twice the wall thickness of the profile, thereby resulting in a thicker frame and a larger distance between the touch area and the front side face of the panel. Therefore, it is easy to cause a false touch. In addition, as the light filtering bar is located on the front side of the panel, the part of the frame on the front side of the panel must be provided with a structure for fixing the light filtering bar, so that the width of the frame is large, and the entire volume of the infrared touch device is caused to be large to be not easy to be placed on the premise of ensuring sufficient touch area.

SUMMARY

Based on the above-mentioned current situation, the main purpose of the present disclosure is to provide an infrared touch device capable of achieving an effect of a narrow frame and a thin frame, reducing a possibility of a false touch, facilitating placement, and possessing good aesthetics.

In order to achieve the above object, in the first aspect, a technical solution adopted by the present disclosure is as follows.

The present disclosure provides an infrared touch device including an infrared board, a light filtering portion, a panel, and an outer frame, the outer frame including a side frame portion, a front frame portion connected to a front end of the side frame portion, and a rear frame portion connected to a rear end of the side frame portion. The side frame portion includes a panel accommodating groove for accommodating an edge of the panel, a rear side face of the front frame portion forms a first side wall of the panel accommodating groove, an end face of a free end of the front frame portion is defined as a first inclined surface, and an obtuse angle is formed between the first inclined surface and the first side wall. The first inclined surface forms a first reflecting surface, or a first reflecting layer is provided on the first inclined surface and an outer surface of the first reflecting layer forms a first reflecting surface, and at least part of infrared light emitted by the infrared board passes through the light filtering portion and the panel in sequence, and is reflected by the first reflecting surface to propagate on a front side of the panel in a direction parallel to a front side face of the panel.

Optionally, the side frame portion includes a plate body, a first protrusion is provided on the plate body and is disposed opposite to the front frame portion, a front side face of the first protrusion forms a second side wall of the panel accommodating groove, and an inner side face of the plate body forms a bottom wall of the panel accommodating groove.

Optionally, the side frame portion includes a plate body, a second protrusion is provided on the plate body and is located on a rear side of the panel accommodating groove, a front side face of the second protrusion forms a second inclined surface, the first inclined surface is disposed opposite and perpendicular to the second inclined surface, the second inclined surface forms a second reflecting surface, or a second reflecting layer is provided on the second inclined surface and an outer surface of the second reflecting layer forms a second reflecting surface, so that at least part of light emitted by the infrared board passes through the light filtering portion and the panel after being reflected by the second reflecting surface and reaches the first reflecting surface.

Optionally, the infrared board includes an infrared lamp which is located at a middle position of the second inclined surface in a front-rear direction.

Optionally, the side frame portion includes a plate body, a second protrusion is provided on the plate body and is located on a rear side of the panel accommodating groove, the second inclined surface is a front side face of the second protrusion forms.

Optionally, the second protrusion is configured as a plate-like structure inclined with respect to the plate body.

Optionally, the plate body includes a first plate portion and a second plate portion, the panel accommodating groove is provided on the first plate portion, the second protrusion is provided on the second plate portion or at an interface position between the first plate portion and the second the plate portion, the first plate portion and the second plate portion are arranged in a misalignment in a left-right direction, and the first plate portion protrudes outward with respect to the second plate portion. The plate body further includes a connecting plate portion connecting the first plate portion and the second plate portion, and a non-zero angle is respectively formed between the connecting plate portion and the first plate portion and between the connecting plate portion and the second plate portion. The second protrusion is formed by an extension of a rear end of the connecting plate portion.

Optionally, the infrared touch device further includes an inner frame, a rear end of the inner frame abuts the rear frame portion, and a front end of the inner frame is pasted and connected to the panel. The infrared board is located between the inner frame and the outer frame, the inner frame forms a board accommodating groove for accommodating the infrared board, the board accommodating groove includes a front accommodating groove and a rear accommodating groove, a front end of the infrared board is located in the front accommodating groove, and a rear end of the infrared board is located in the rear accommodating groove.

Optionally, a third protrusion is provided on the side frame portion, the inner frame is provided with a locking groove to be fitted with the third protrusion, and the third protrusion is locked into the locking groove.

Optionally, the light filtering portion is provided on at least a rear side face of an end of the panel closer to the outer frame; and/or, the light filtering portion is configured as an infrared ink printing layer coated on the rear side face.

The present disclosure provides an infrared touch device. In the infrared touch device, the light filtering portion is provided on the rear side of the panel, so that the size between the front surface of the outer frame and the front end face of the panel is greatly reduced. The size mainly includes the size of the first inclined surface in the front-rear direction, so that the infrared touch device achieves an effect of a thin frame. Therefore an effect of being close to be flat between the outer frame and the panel is better achieved and a possibility of an accidental touch is avoided. In addition, the light filtering portion is provided at the rear side of the panel to avoid a structure for placing the light filtering portion to be provided on the front side of the panel. Therefore a width and thickness of the outer frame can be reduce to a certain extent, and an effect of a narrow frame is achieved. At the same time, the light filtering portion is provided on the rear side of the panel to reduce a risk of the light filtering portion falling off. Therefore a reliability of the infrared touch device is improved, and the user experience is improved. In addition, the end face of the free end of the front frame part is defined as the first inclined surface, and an obtuse angle is formed between the first inclined surface and the first side wall, and the panel accommodating groove for accommodating the side of the panel is located on the rear side of the first inclined surface, so that at least part of the infrared light emitted by the infrared board passes through the light filtering portion and the panel in sequence, then is reflected by the reflecting surface to propagate on the front side of the panel in a direction parallel to the front side face of the panel to achieve an infrared touch effect.

In a second aspect, the present disclosure provides a profile used to form the outer frame of the above infrared touch device.

The present disclosure also provides a profile. The end face of the free end of the front frame part of the profile is defined as the first inclined surface, an obtuse angle is formed between the first inclined surface and the first side wall, and the panel accommodating groove for accommodating the side of the panel is located on the rear side of the first inclined surface. Therefore, in the infrared touch device formed by the outer frame formed by the profile, the light filtering portion is provided on the rear side of the panel, so that the size between the front surface of the outer frame and the front end face of the panel is greatly reduced. The size mainly includes the size of the first inclined surface in the front-rear direction, so that the infrared touch device achieves an effect of a thin frame. Therefore an effect of being close to be flat between the outer frame and the panel is better achieved and a possibility of an accidental touch is avoided. In addition, the light filtering portion is provided at the rear side of the panel to avoid a structure for placing the light filtering portion to be provided on the front side of the panel. Therefore a width and thickness of the outer frame can be reduce to a certain extent, and an effect of a narrow frame is achieved. At the same time, the light filtering portion is provided on the rear side of the panel to reduce a risk of the light filtering portion falling off. Therefore a reliability of the infrared touch device is improved, and the user experience is improved. At least part of the infrared light emitted by the infrared board passes through the light filtering portion and the panel in sequence, then is reflected by the reflecting surface to propagate on the front side of the panel in a direction parallel to the front side face of the panel to achieve an infrared touch effect.

BRIEF DESCRIPTION OF THE DRAWINGS

Hereinafter, optional embodiments of the present disclosure will be described with reference to the drawings. In the drawings.

Figure 1:
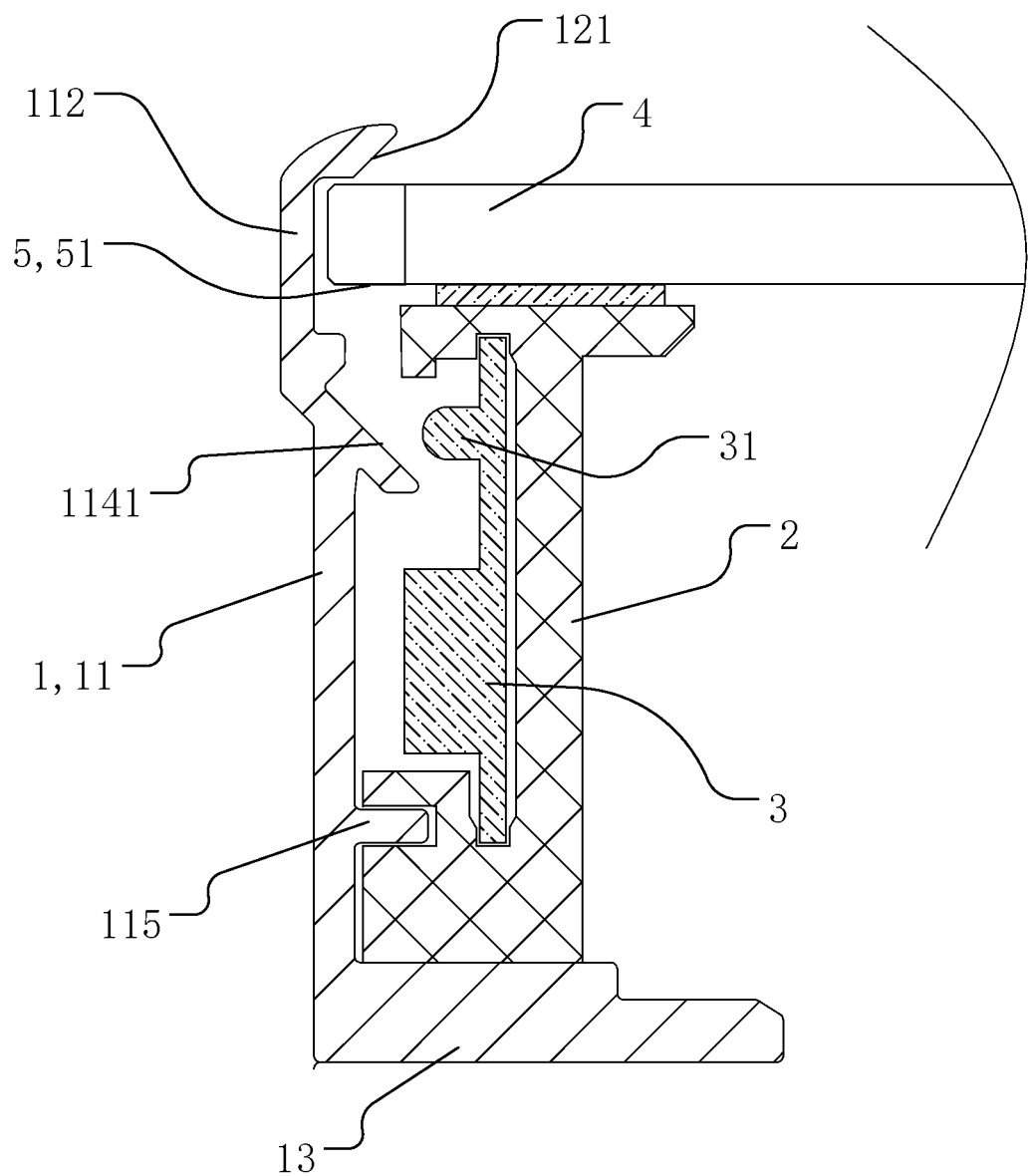
FIG. 1 is a schematic structural diagram of an optional embodiment of an infrared touch device provided by the present disclosure.

In the drawings:
1. Outer frame; 11. Side frame portion; 111, panel accommodating groove; 112, plate body; 1121, first plate portion; 1122, second plate portion; 1123, connecting plate portion; 113, first protrusion; 114, second protrusion; 1141, second inclined surface; 115, third protrusion; 12, front frame portion; 121, first inclined surface; 13, rear frame portion; 2, inner frame; 21, board accommodating groove; 211, front accommodating groove; 212, rear accommodating groove; 22, locking groove; 3. infrared board; 31, infrared lamp; 4. panel; 5. light filtering portion; 51, infrared ink printing layer.

DETAILED DESCRIPTION

The present disclosure is described below based on embodiments. But the present disclosure is not limited to these embodiments. In the following detailed description of the present disclosure, some specific details are described in detail. In order to avoid confusing the essence of the present disclosure, well-known methods, processes, procedures, and elements have not been described in detail.

In addition, those skilled in the art should understand that the drawings provided herein are for illustrative purposes, and the drawings are not necessarily drawn to scale.

Unless clearly required in the context, the words "including", "comprising" and the like in the entire specification and claims should be interpreted as inclusive rather than exclusive or exhaustive; that is, the meaning of "including but not limited to".

In the description of the present disclosure, it should be understood that the terms "first", "second", etc. are for descriptive purposes only and cannot be understood as indicating or implying relative importance. In addition, in the description of the present disclosure, unless otherwise stated, the meaning of "plurality" is two or more. Among them, "front", "rear", "inner" and "outer" in the present disclosure are only used for the purpose of description, so as to facilitate a better understanding of relative positions of structures, and there is no limiting effect. Among them, "front" and "rear" refer to front and rear in a use state. That is, a touch side of the infrared touch device is defined as "front", the opposite side of the touch side is defined as "rear"; the side of the infrared touch device near the center is defined as "inner", and the side away from the center is "outer". In addition, in the present disclosure, in the use state of the infrared touch device, "thickness" refers to the distance in a front-rear direction.

In a traditional infrared touch device, a light filtering bar is located on a front side of a panel and is installed on an outer frame. The infrared board (PCBA) is located outside of the light filtering bar, so that an infrared light source on it faces the light filtering bar. Therefore, the infrared light emitted by the infrared light source can enter the light filtering bar, then exit through the light filtering bar, and enter an opposite light filtering bar along a front surface of the panel. A process of the infrared board receiving the infrared light is just the opposite. The infrared light from the opposite light filtering bar enters the light filtering bar on a receiving side, then exits through the light filtering bar and is received by the infrared board. In the infrared touch device of the above type, there is at least one dimension of a wall thickness of a profile respectively between the light filtering bar and the front surface of the frame, and between the light filtering bar and the panel, which makes a height of the front surface of the frame of the infrared touch device larger than the bigger size of the panel, and the bigger size is at least equal to the width of the light filtering bar plus twice the wall thickness of the profile, thereby resulting in a thicker frame and a larger distance between the touch area and the front side face of the panel. Therefore, it is easy to cause a false touch. In addition, as the light filtering bar is located on the front side of the panel, the part of the frame on the front side of the panel must be provided with a structure for fixing the light filtering bar, so that the width of the frame is large, and the entire volume of the infrared touch device is caused to be large to be not easy to be placed on the premise of ensuring sufficient touch area. The wider and thicker frame cannot achieve the effect of being close to be flat between the frame and the panel, and the aesthetics of the infrared touch device is also poor.

Figure 2:
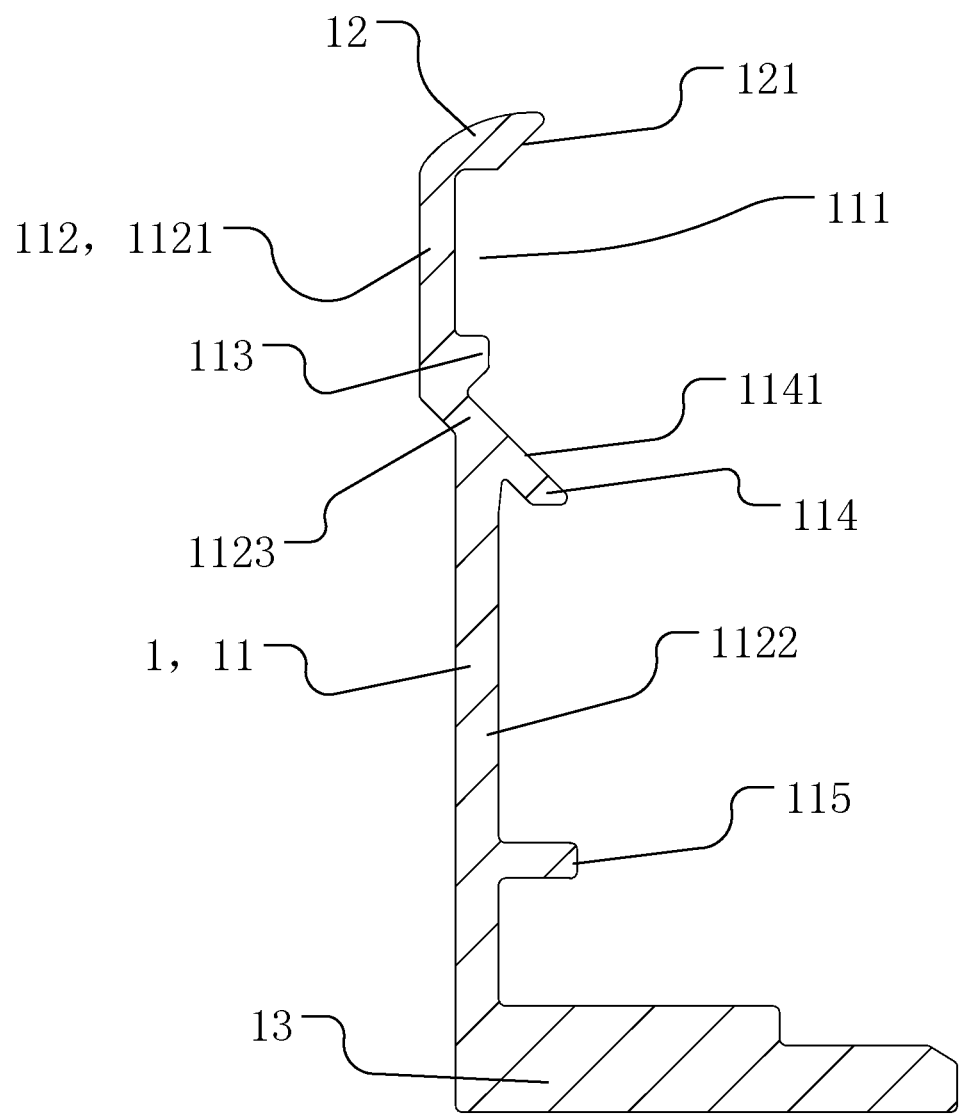
FIG. 2 is a schematic structural diagram of an optional embodiment of an outer frame of an infrared touch device provided by the present disclosure.
Figure 3:
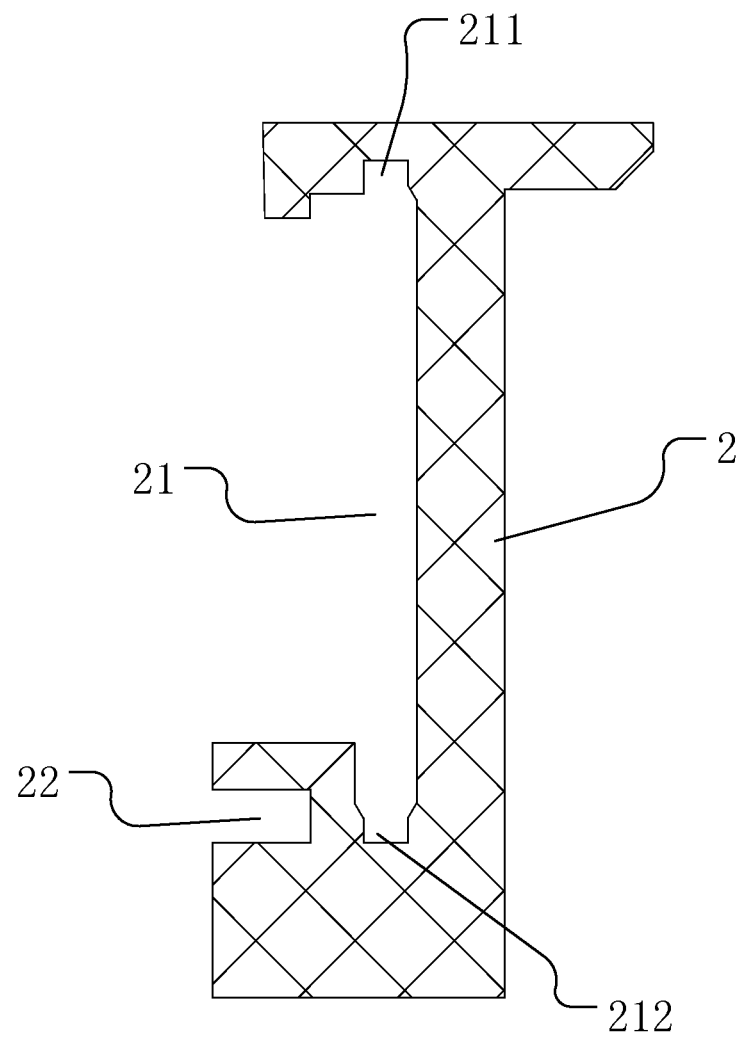
FIG. 3 is a schematic structural diagram of an optional embodiment of an inner frame of an infrared touch device provided by the present disclosure.

Referring to FIGS. 1-3, the present disclosure provides an infrared touch device and a profile for forming an outer frame 1 of the infrared touch device. The infrared touch device is, for example, an infrared touch display screen, a multimedia interactive screen, or a multimedia integrated machine, etc. The infrared touch device includes an infrared board 3, a light filtering portion 5, a panel 4, and a frame. The frame includes an outer frame 1 formed by the aforementioned profile. The profile may be made of metal or other materials, such as plastic. In light of requirements of structural strength, ease of processing, cost, weight, etc. of the outer frame 1, an aluminum profile can be selected. As shown in FIG. 2, the profile includes a side frame portion 11, a front frame portion 12 connected to a front end of the side frame portion 11 and a rear frame portion 13 connected to a rear end of the side frame portion 11. Referring to FIG. 1, the side frame portion 11 includes a panel accommodating groove 111 for accommodating a side of the panel 4 of the infrared touch device to ensure a fixed installation of the panel 4. A rear side face of the front frame portion 12 forms a first side wall of the panel accommodating groove 111. An end face of a free end of the front frame portion 12 is defined as a first inclined surface 121. An obtuse angle is formed between the first inclined surface 121 and the first side wall. The first inclined surface 121 forms a first reflecting surface. For example, the first reflecting surface is formed by high-speed drilling of an aluminum profile. Or, a first reflecting layer is provided on the first inclined surface 121, and an outer surface of the first reflecting layer forms the first reflecting surface. Or, the first reflecting surface is formed by other processing methods, as long as a reflecting surface for reflecting light can be formed at the position of the first inclined surface 121. At least part of infrared light emitted by the infrared board 3 passes through the light filtering portion 5 and the panel 4 in sequence, and then is reflected by the first reflecting surface to propagate on a front side of the panel 4 in a direction parallel to the front side face of the panel 4, thereby realizing an infrared touch function. The outer frame 1 is formed by the above-mentioned profile, and a structure of the infrared touch device formed by the outer frame 1 is more reasonable. The light filtering portion 5 is provided on a rear side of the panel 4, so that a size between a front surface of the outer frame 1 and an end face of the panel 4 is greatly reduced, and the size mainly includes a size of the first inclined surface 121 in a front-rear direction. Therefore, in the infrared touch device, the effect of a thinner frame is achieved, the effect of being close to be flat between the outer frame 1 and the panel 4 is better achieved, the possibility of a false touch is reduced, and the aesthetics of the infrared touch device is also good. In addition, when the light filtering portion 5 is provided on the rear side of the panel 4, a structure for placing the light filtering portion 5 provided on the outer frame 1 on the front side of the panel 4 can be avoided. Therefore, the width and thickness of the outer frame 1 can be reduced to a certain extent to achieve an effect of a narrow frame. At the same time, the light filtering portion 5 provided on the rear side of the panel 4 can reduce a risk of the light filtering portion 5 falling off, improve a reliability of the infrared touch device, and improve a user experience. It should be noted that the above-mentioned first reflecting layer may be formed by optically reflective paint or reflecting strips.

Optionally, referring to FIGS. 1-3, the light filtering portion 5 is located at an end of the outer frame 1 closer to the panel 4, and the placement of the light filtering portion 5 is reasonably arranged to reduce the size of the outer frame 1 in an inner-outer direction. The light filtering portion 5 in the present disclosure can be processed into a suitable structure by a conventional light filtering bar, installed on the rear side of the panel 4, and fixed by the outer frame 1 and/or the inner frame 2. Or, other forms can be used. For example, the light filtering portion 5 is cut into a sheet shape and pasted on the rear side face of the panel 4. Optionally, the light filtering portion 5 of the infrared touch device in the present disclosure is an infrared ink printing layer 51 coated on the rear side face of the panel 4. The infrared ink is directly applied on the rear side face of the panel 4 to save the traditional light filtering bar structure to further reduce the space occupation of the light filtering portion 5. And at the same time, the falling off of the light filtering portion 5 can be better prevented and the user experience is improved. It should be noted that the above-mentioned infrared ink printing layer 51 may be applied only to the rear side face of the end of the panel 4 (the end refers to a position closer to the outer frame 1), or may be applied to each side face of the entire end. Optionally, the coating is only applied on the rear side face to not only ensure a light filtering effect, but also reduce a coating area, improve a production effect, and reduce a production cost.

Further, referring to FIG. 1 and FIG. 2, the side frame portion 11 further includes a second inclined surface 1141. The second inclined surface 1141 is located at the rear side of the accommodating groove 111, and the first inclined surface 121 is opposite and perpendicular to the second inclined surface 1141. The second inclined surface 1141 forms a second reflecting surface, or a second reflecting layer is provided on the second inclined surface 1141 and the outer surface of the second reflecting layer forms a second reflecting surface. The second reflecting surface and the first reflecting surface may be formed in the same processing method or in different ways. At least part of the light emitted by the infrared board 3 is reflected by the second reflecting surface, then passes through the light filtering portion 5 and the panel 4, and reaches the first reflecting surface. By providing the second reflecting surface, a limitation that an infrared light emission position in the conventional infrared touch device must face to the filter bar is eliminated, so that the infrared board 3 can be better arranged. Therefore, the infrared light emission position and the second reflecting surface of the infrared touch device in the present disclosure corresponding to each other. That is, a thickness direction of the infrared board 3 is arranged along the inner-outer direction of the infrared touch device, thereby reducing the size of the infrared board 3 in the inner-outer direction, better ensuring the area of a touch area of the panel, and improving the aesthetics of the infrared touch device. Optionally, the infrared board 3 includes an infrared lamp 31, and the infrared lamp 31 is located at a middle position of the second inclined surface 1141 in the front-rear direction to ensure that the second reflecting surface can reflect more infrared light and ensure a good touch control effect.

Optionally, referring to FIGS. 1 and 2, the side frame portion 11 further includes a plate body 112, and a first protrusion 113 is provided on the plate body 112. The first protrusion 113 is disposed opposite to the front frame portion 12. A front side face of the protrusion 113 forms a second side wall of the panel accommodating groove 111, and an inner side face of the plate body 112 forms a bottom wall of the panel accommodating groove 111. That is, the plate body 112 includes two opposite side faces in the inner-outer direction (i.e., in the left-right direction in the figures), one of which is farer away from the panel 4, the other is closer to the panel 4, and the side face of the panel 4 closer to the panel 4 forms the bottom wall of the panel accommodating groove 111. The panel body 112 restricts a movement of the panel 4 to the outside, and the first protrusion 113 and the front frame portion 12 restrict a movement of the panel 4 in the front-rear direction, thereby ensuring stable installation of the panel 4. Further, the plate body 112 is further provided with a second protrusion 114 located on the rear side of the panel accommodating groove 111. The front side face of the second protrusion 114 constitutes the above-mentioned second inclined surface 1141, and an obtuse angle is formed between the second inclined surface 1141 and the plate body 112. That is, the second inclined surface 1141 is the front side face of the second protrusion 114, so as to ensure that the second reflecting surface and the first reflecting surface are perpendicular to each other, and ensure that the infrared light emitted by the infrared board 3 can propagate parallel to the front side face of the panel 4 after being reflected twice respectively by the second reflecting surface and the first reflecting surface to ensure a touch effect. Furthermore, the second protrusion 114 is configured as a plate-like structure inclined with respect to the plate body 112, which makes the overall structure of the outer frame 1 more harmonious, ensures the balance of the structural strength at each position, at the same time facilitates the processing of the second inclined surface 1141 and improves productivity.

Referring to FIGS. 1 and 2, optionally, the plate body 112 includes a first plate portion 1121 and a second plate portion 1122. The panel accommodating groove 111 is provided in the first plate portion 1121. The second protrusion 114 is provided on the second plate portion 1122, or at an interface position between the first plate portion 1121 and the second plate portion 1122. The first plate portion 1121 and the second plate portion 1122 are arranged in a misalignment in the inner-outer direction (i.e., in the left-right direction in the figures), and the first plate portion 1121 protrudes outside relative to the second plate portion 1122, so as to better provide accommodation space for the side of the panel 4. On the one hand, a stable installation of the panel 4 can be better ensured. On the other hand, an area for coating the infrared ink printing layer 51 can be sufficiently provide. That is, the size of the light filtering portion 5 in the inner-outer direction can be better ensured, and sufficient light can pass through the filter portion 5, thereby ensuring a good touch effect and improving user experience. The size of the light filtering portion 5 in the inner-outer direction can be selected to be about 5 mm to ensure that enough light passes through and avoid affecting the appearance of the infrared touch device as the size is too large. Further, the plate body 112 further includes a connecting plate portion 1123 connecting the first plate portion 1121 and the second plate portion 1122. A non-zero angle is formed respectively between the connecting plate portion 1123 and the first plate portion 1121 and between the connecting plate portion 1123 and the second plate portion 1122. A right angle is avoided at a connection position of the first plate portion 1121 and the second plate portion 1122 to ensure the structural strength of the connection position of the first plate portion 1121 and the second plate portion 1122. Furthermore, the second protrusion 114 is formed by an extension of a rear end of the connecting plate portion 1123. Therefore, a positional condition of the connecting plate portion 1123 is reasonably used. The second protrusion 114 and the two inclined surfaces 1141 being formed by an extension of the rear end of the connecting plate portion 1123 optimizes the overall structure of the outer frame 1 and improves the structural strength of the profile to a certain extent.

Optionally, referring to FIGS. 1-3, the infrared touch device further includes an inner frame 2, a rear end of the inner frame 2 abuts the rear frame portion 13, and a front end of the inner frame 2 is pasted and connected to the panel 4, for example, by removable adhesive or glue. Therefore, a reliable installation of the inner frame 2 and the panel 4 is better ensured. Of course, the inner frame 2 and the panel 4 can also be fixedly connected in other ways. Further, the infrared board 3 is located between the inner frame 2 and the outer frame 1. As shown in FIG. 3, the inner frame 2 forms a board accommodating groove 21 for accommodating the infrared board 3. The board accommodating groove 21 includes a front accommodating groove 211 and a rear accommodating groove 212, the front end of the infrared board 3 is located in the front accommodating groove 211, and the rear end of the infrared board 3 is located in the rear accommodating groove 212, thereby ensuring the fixed installation of the infrared board 3. It should be noted that the front accommodating groove 211 and the rear accommodating groove 212 may adopt the same structural form or different structural forms. A main purpose of providing the front accommodating groove 211 and the rear accommodating groove 212 is to fix the infrared board 3.

Optionally, referring to FIGS. 1-3, a third protrusion 115 is provided on the second plate portion 1122, the third protrusion 115 and the first protrusion 113 protrude in the same direction, and the inner frame 2 is provided with a locking groove 22 fitted with the third protrusion 115. The third protrusion 115 is locked into the locking groove 22. As the third protrusion 115 fitted with the locking groove 22, on the one hand, a stability of a connection between the outer frame 1 and the inner frame 2 can be improved, on the other hand, a correct installation of the outer frame 1 and the inner frame 2 can also be ensured as being positioned, and a stable and correct installation of the outer frame 1 and the inner frame 2 is further ensured. Therefore, a stable installation of the infrared board 3 is ensured, and a normal use of the infrared touch device is better ensured.

In the infrared touch device in the present disclosure, use experience of being close to a capacitive flat screen can be realized, and a width of a black border screen printing commonly used in the traditional infrared touch device can be further reduced. Therefore a design effect of a narrow frame is achieved, a feel of In-Cell is obtained. At the same time, the traditional light filtering bar can be omitted, which further simplifies a quality problem caused by the light filtering bar.

Those skilled in the art can understand that the above optional solutions can be freely combined and superimposed on the premise of no conflict.

It should be understood that the above-mentioned embodiments are only exemplary, and not limiting. Without departing from the basic principles of the present disclosure, those skilled in the art can make various obvious or equivalent modifications or replacements to the above details which will be included in the scope of the claims of the present disclosure.

What is claimed is:

1. An infrared touch device comprising an infrared board for emitting and receiving infrared light, a light filtering portion, a panel, and an outer frame, the outer frame comprising a side frame portion, a front frame portion connected to a front end of the side frame portion, and a rear frame portion connected to a rear end of the side frame portion,
wherein
the side frame portion comprises a panel accommodating groove for accommodating an edge of the panel, a rear side face of the front frame portion forms a first side wall of the panel accommodating groove, an end face of a free end of the front frame portion is defined as a first inclined surface, and an obtuse angle is formed between the first inclined surface and the first side wall, and
the first inclined surface forms a first reflecting surface, or a first reflecting layer is provided on the first inclined surface, an outer surface of the first reflecting layer forms a first reflecting surface, and at least part of the infrared light emitted by the infrared board passes through the light filtering portion and the panel in sequence, and is reflected by the first reflecting surface to propagate on a front side of the panel in a direction parallel to a front side face of the panel.

2. The infrared touch device according to claim 1, wherein the side frame portion comprises a plate body, a first protrusion is provided on the plate body and is disposed opposite to the front frame portion, a front side face of the first protrusion forms a second side wall of the panel accommodating groove, and an inner side face of the plate body forms a bottom wall of the panel accommodating groove.

3. The infrared touch device according to claim 1, wherein the side frame portion comprises a plate body, a second protrusion is provided on the plate body and is located on a rear side of the panel accommodating groove, a front side face of the second protrusion forms a second inclined surface, the first inclined surface is disposed opposite and perpendicular to the second inclined surface, the second inclined surface forms a second reflecting surface, or a second reflecting layer is provided on the second inclined surface and an outer surface of the second reflecting layer forms a second reflecting surface, so that at least part of light emitted by the infrared board passes through the light filtering portion and the panel after being reflected by the second reflecting surface and reaches the first reflecting surface.

4. The infrared touch device according to claim 3, wherein the infrared board comprises an infrared lamp which is located at a middle position of the second inclined surface in a front-rear direction.

5. The infrared touch device according to claim 3, wherein the second protrusion is configured as a plate-like structure inclined with respect to the plate body.

6. The infrared touch device according to claim 3, wherein the plate body comprises a first plate portion and a second plate portion, the panel accommodating groove is provided on the first plate portion, the second protrusion is provided on the second plate portion or at an interface position between the first plate portion and the second the plate portion, the first plate portion and the second plate portion are arranged in a misalignment in a left-right direction, and the first plate portion protrudes outward with respect to the second plate portion;
the plate body further comprises a connecting plate portion connecting the first plate portion and the second plate portion, and a non-zero angle is respectively formed between the connecting plate portion and the first plate portion and between the connecting plate portion and the second plate portion; and
the second protrusion is formed by an extension of a rear end of the connecting plate portion.

7. The infrared touch device according to claim 6, wherein the infrared touch device further comprises an inner frame, a rear end of the inner frame abuts the rear frame portion, and a front end of the inner frame is pasted and connected to the panel; and
the infrared board is located between the inner frame and the outer frame, the inner frame forms a board accommodating groove for accommodating the infrared board, the board accommodating groove comprises a front accommodating groove and a rear accommodating groove, and a front end of the infrared board is located in the front accommodating groove, and a rear end of the infrared board is located in the rear accommodating groove.

8. The infrared touch device according to claim 7, wherein a third protrusion is provided on the side frame portion, the inner frame is provided with a locking groove to be fitted with the third protrusion, and the third protrusion is locked into the locking groove.

9. The infrared touch device according to claim 6, wherein
the light filtering portion is provided on at least a rear side face of an end of the panel closer to the outer frame; and/or,
the light filtering portion is configured as an infrared ink printing layer coated on the rear side face.

\* \* \* \* \*